(12) United States Patent
Hussain et al.

(10) Patent No.: US 10,580,664 B2
(45) Date of Patent: Mar. 3, 2020

(54) DECAL ELECTRONICS FOR PRINTED HIGH PERFORMANCE CMOS ELECTRONIC SYSTEMS

(71) Applicant: KING ABDULLAH UNIVERSITY OF SCIENCE AND TECHNOLOGY, Thuwal (SA)

(72) Inventors: Muhammad Mustafa Hussain, Austin, TX (US); Galo Torres Sevilla, Tungurahua (EC); Marlon Diaz Cordero, Thuwal (SA); Arwa T. Kutbee, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/097,961

(22) PCT Filed: May 12, 2017

(86) PCT No.: PCT/IB2017/052816
§ 371 (c)(1),
(2) Date: Oct. 31, 2018

(87) PCT Pub. No.: WO2017/199148
PCT Pub. Date: Nov. 23, 2017

(65) Prior Publication Data
US 2019/0148170 A1     May 16, 2019

Related U.S. Application Data

(60) Provisional application No. 62/337,207, filed on May 16, 2016.

(51) Int. Cl.
*H05K 3/30*     (2006.01)
*H01L 21/48*    (2006.01)
(Continued)

(52) U.S. Cl.
CPC ...... *H01L 21/4867* (2013.01); *H01L 23/5387* (2013.01); *H01L 23/5389* (2013.01);
(Continued)

(58) Field of Classification Search
CPC ............. H01L 21/4867; H01L 23/5389; H01L 23/5387; H05K 3/125; B33Y 10/00; Y10T 29/4913; Y10T 29/49146
(Continued)

(56) References Cited

U.S. PATENT DOCUMENTS 6,259,962 B1 *  7/2001  Gothait ................... B29C 41/36
                                                   700/119
9,520,293 B2   12/2016  Hussain et al.
(Continued)

FOREIGN PATENT DOCUMENTS

EP         1635158 A2    3/2006

OTHER PUBLICATIONS

Hou, y., et al., "Low Resistive Gallium Doped Nanocrystalline Zinc Oxide for Reducing Gas Sensor Application Via Sol-Gel Process," Sensors and Actuators B: Chemical, International Journal Devoted to Research and Development of the Physical and Chemical Transducers, Elsevier BV, NL, Jul. 27, 2014, vol. 204, pp. 310-318.
(Continued)

*Primary Examiner* — Donghai D Nguyen
(74) *Attorney, Agent, or Firm* — Patent Portfolio Builders PLLC

(57) ABSTRACT

High performance complementary metal oxide semiconductor (CMOS) electronics are critical for any full-fledged electronic system. However, state-of-the-art CMOS electronics are rigid and bulky making them unusable for flexible electronic applications. While there exist bulk material reduction methods to flex them, such thinned CMOS electronics are fragile and vulnerable to handling for high
(Continued)

throughput manufacturing. Here, we show a fusion of a CMOS technology compatible fabrication process for flexible CMOS electronics, with inkjet and conductive cellulose based interconnects, followed by additive manufacturing (i.e. 3D printing based packaging) and finally roll-to-roll printing of packaged decal electronics (thin film transistors based circuit components and sensors) focusing on printed high performance flexible electronic systems. This work provides the most pragmatic route for packaged flexible electronic systems for wide ranging applications.

18 Claims, 13 Drawing Sheets

(51) Int. Cl.
*H01L 23/538* (2006.01)
*H05K 3/12* (2006.01)
*B33Y 10/00* (2015.01)

(52) U.S. Cl.
CPC ............ *H05K 3/125* (2013.01); *B33Y 10/00* (2014.12); *Y10T 29/49146* (2015.01)

(58) Field of Classification Search
USPC .................................. 29/832, 841, 829, 846
See application file for complete search history.

(56) References Cited

U.S. PATENT DOCUMENTS

| | | | |
|---|---|---|---|
| 9,559,080 B2* | 1/2017 | Lim | .................... H01L 23/3135 |
| 9,993,921 B2* | 6/2018 | Lessing | .................... B25J 9/142 |
| 2014/0239459 A1 | 8/2014 | Hussain et al. | |
| 2015/0076683 A1 | 3/2015 | Lim et al. | |
| 2016/0052131 A1 | 2/2016 | Lessing et al. | |

OTHER PUBLICATIONS

International Search Report in related International Application No. PCT/IB2017/052816, dated Jul. 28, 2017.
Written Opinion of the International Searching Authority in related International Application No. PCT/IB2017/052816, dated Jul. 28, 2017.

\* cited by examiner

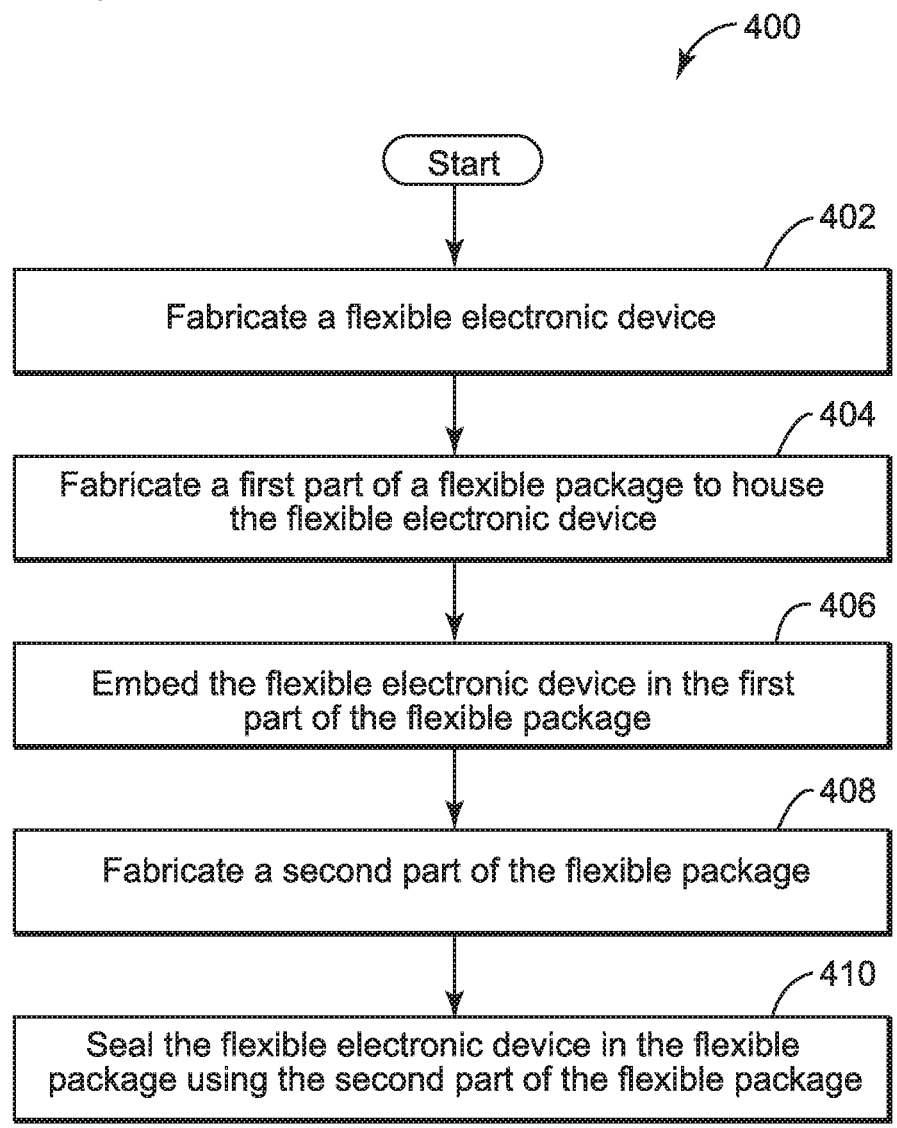

DECAL ELECTRONICS FOR PRINTED HIGH PERFORMANCE CMOS ELECTRONIC SYSTEMS

CROSS-REFERENCE TO RELATED PATENT APPLICATIONS

This application is a U.S. National Stage of International Application No. PCT/IB2017/052816, filed on May 12, 2017, which claims priority and benefit from U.S. Provisional Patent Application No. 62/337,207 by Hussain et al., filed on May 16, 2016 and entitled "Decal Electronics for Printed High Performance CMOS Electronic Systems", the contents of which are hereby incorporated by reference in their entirety.

FIELD OF THE DISCLOSURE

The instant disclosure relates to electronic devices. More specifically, portions of this disclosure relate to flexible electronic devices.

BACKGROUND

Computing devices have been quickly integrating into every aspect of everyday life. For example, cellular phones have gone from being rare devices to in every pocket. Those same cellular phones have also developed in computing power from mere mobile phones to mobile computers, capable of running applications and performing all the tasks of a modern computer. Most of the electronics for these conventional devices are manufactured using conventional silicon substrate-based manufacturing and design. However, the size and rigidity of the silicon substrate or other semiconductor substrate makes the electronic devices unsuitable for some environments. An approach for manufacturing these conventional devices is shown in FIG. 1. FIG. 1 is a block diagram illustrating conventional manufacturing of electronic devices according to the prior art. At block 102, fabricated devices may be manufactured on a substrate, such as through material deposition, photolithography, etching, and the like. Many devices are fabricated on one large substrate. At block 104, those different devices are diced by laser into individual silicon dies shown at block 106. Each silicon die is then packaged into an integrated circuit (IC) at block 108.

The concept of ubiquitous computing is continuing to develop, such as in the developing Internet of Everything (IoE), but a key factor in continuing ubiquitous computer's expansion is in manufacturing capability. Devices must be cheap to manufacture and easy to place in various environments in order to deploy of trillions of devices and sensors throughout the world. Some work has been done in the manufacturing of flexible semiconductor devices. One predominant focus has been to demonstrate flexible and stretchable sensors, energy harvesters, and storage to break the status quo of rigid, bulky, and planar devices to build electronics that can comply with the soft moduli of skin and follow its asymmetric terrain to be in conformal intimate contact for enhanced functionality in monitoring. Often times, conventional sensor technologies provide analog signal data that needs to be digitalized for further processing, and then rigid and bulky integrated circuits (ICs) are again required.

One conventional technology developed to improve manufacturing of ubiquitous computing devices involves body integrated systems using microfluidic assisted assembly and environment or direct bonding on flexible printed circuit boards (PCBs). However, those ICs are rigid and typically occupy 1 $cm^2$ area or more. These constraints limit the system's compliance with our skin, and creates localized hot spots to make our experience highly uncomfortable and unhealthy. Thus, further efforts in manufacturing devices for ubiquitous computing are needed.

SUMMARY

A system for producing flexible decal electronic devices may be used to fabricate decal electronic devices, such as sensors, transistors, oscillators, etc., that are more flexible than conventional rigid electronic devices. This flexibility can provide such devices with greater durability and resilience and allow for applications that necessitate enhanced flexibility.

In some embodiments, devices may be fabricated using a 3D printer to assemble flexible packaging. The properties of the 3D printed packaging may be optimized to account for the desired features of the flexible electronic device. For example, the flexible packaging may be fabricated to be more porous. The flexible packaging may consist of a first layer and a second layer. The 3D printer may first print the first layer of the flexible packaging. The printer may then be paused to allow for embedding of a flexible electronic device into the structure. An adhesive may be used to secure the flexible electronic device in the first layer. Conductive strips may then be attached to a plurality of contacts of the flexible electronic device to allow for electric contact to the device. The conductive strips maybe be flexible and made of a conductive substance, such as aluminum foil. Such flexibility may allow for the strips to maintain an effective connection between the decal electronic device and the devices to which it is connected in the event of flexing of the decal electronic device. Then, the 3D printer may resume printing and print the second layer of the flexible packaging on top of the first layer and the embedded flexible electronic device. Thus, the 3D printer may be used to house one or more flexible electronic devices in a flexible packaging, creating a flexible electronic device. In some embodiments, decal may include adhesives such that the decal may be used as a sticker device.

Two-dimensional (2D) flat plane flexible complimentary metal-oxide-semiconductor (CMOS) electronic systems may be manufacturing by integrating electronics and sensors. The electronics may be manufactured with a zinc oxide (ZnO) process, and the sensors may be manufacturing with an aluminum (Al) process. Although specific manufacturing techniques and materials are described, flexible devices may be manufactured using many known materials and by adapting known techniques. Further, systems may include one or both of electronics and sensors. Additionally, systems may be manufactured as 3D systems by building multiple layers of circuitry before incorporating the device into packaging.

In some embodiments, manufacturing may include inkjet printing, conductive cellulose-based interconnects in a 3D printed package, and/or roll-to-roll printing at the rate of up to or exceeding tens of cm/min of decal electronic systems. Using these, and other, manufacturing techniques, high-quality electronics may be manufactured at a high-throughput manufacturing line using one or more of polymeric, cellulose, and/or glass materials. This may be particularly advantageous for Internet of Everything applications that are data oriented, by allowing sensors and actuators to be integrated monolithically or heterogeneously with fast, low power, and high performance logic and radio frequency (RF) devices.

Embodiments and techniques described herein provide a pragmatic route for high-throughput manufacturing of fully-packaged decal electronic systems that can be made affordable, compact, lightweight, reliable, and stylish for a wide implementation of wearable electronic systems and ubiquitous computing to realize the Internet of Everything. Rigorous mechanical and electrical characteristics study show uncompromised performance during flexing, packaging, and interconnecting of electronic and sensing devices, and little to no deviance in device performance compared to traditional silicon substrate-based electronic circuits.

According to one embodiment, a method for fabricating a flexible electronic decal may include fabricating a flexible electronic device; fabricating a first part of a flexible package to house the electronic device; embedding the flexible electronic device in the first part of the flexible package; fabricating a second part of the flexible package to house the electronic device; and/or sealing the flexible electronic device in the flexible package using the second part of the flexible package.

In certain embodiments, the step of fabricating the second part of the flexible package may include printing the second part onto the first part of the flexible electronic device using a 3D printer; the printing step may seal the flexible electronic device in the flexible package; the step of sealing the flexible electronic device may include attaching the second part of the flexible package to the first part of the flexible package to encase the flexible electronic device; the flexible electronic device may include at least one of a NAND gate, NOR gate, inverter, and buffer; the flexible electronic device may include a flexible sensor; the flexible electronic device may include a ring oscillator; the step of fabricating a first part of the flexible package may include printing a first layer of a decal using a 3D printer; the step of embedding the flexible electronic device in the first part of the flexible package may include placing the flexible electronic device in a cavity in the first part of the flexible package and bonding a plurality of flexible conductive strips to a plurality of contacts of the flexible electronic device; and/or the electronic device may include circuitry and contacts, in which the step of fabricating the flexible electronic device comprises the fabricating circuitry with a ZnO process and fabricating contacts with an Al process.

In some embodiments, portions of or all of the fabricating of the flexible electronic decal is performed with roll-to-roll printing. Once the devices are packaged they can be printed at high speeds in a parallel fashion using roll printing techniques. This may eliminate or reduce the use of high accuracy chip placing and bonding machines and may increase the throughput of the system and decreases the capital costs. The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 4 is a flow chart illustrating one exemplary method for manufacturing a packaged flexible electronic device according to one embodiment of the disclosure.

DETAILED DESCRIPTION

Figure 2:
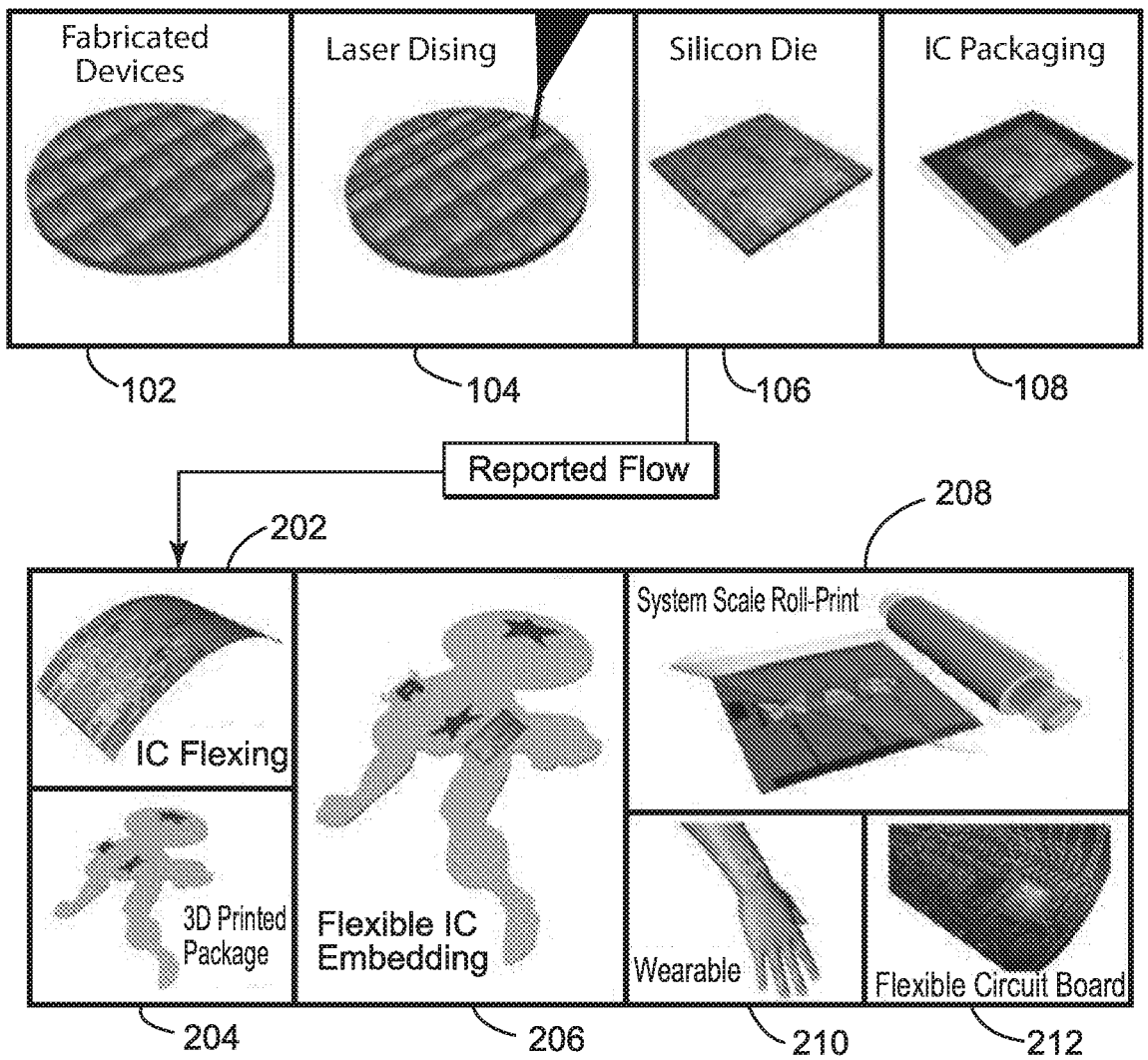
FIG. 2 is a block diagram illustrating manufacturing of packaged flexible electronic devices according to one embodiment of the disclosure.

FIG. 2 is a block diagram illustrating manufacturing of packaged flexible electronic devices according to one embodiment of the disclosure. Blocks 102, 104, and 106 as described regarding the prior art may be performed to form a silicon die on a substrate. Although prior art manufacturing techniques were discussed for blocks 102, 104, and 106, embodiments of this invention may use a die manufactured by any manufacturing technique for forming flexible electronics. Rather than perform conventional IC packaging on the silicon die of block 106, the silicon die is reported to a processing flow for flexible electronics. At block 202, a flexible integrated circuit (IC) may be manufactured from the silicon die of block 106. To make the silicon die flexible, a substrate of the silicon die may be thinned to form a flexible integrated circuit. In one embodiment, the thinning may be performed by grinding or otherwise etching back the substrate from a bottom side of the substrate that does not contain the electronics. In another embodiment, the thinning may be performed by releasing a top portion of the silicon die and substrate from a bulk of the substrate, such as described in U.S. patent application Ser. No. 14/238,526 to Hussain et al., the content of which is hereby incorporated by reference in its entirety. Separately, a printed package may be formed at block 204, such as by 3D printing. At block 206, the flexible IC of block 202 and the 3D printed package of block 204 may be combined, such as by embedding the flexible IC into the 3D printed package. The flexible IC in the flexible package may be formed into decals using a system scale roll-print process at block 208 to form decals. The decals may be wearable as shown in block 210 or used as flexible circuit boards as shown in block 212.

Figure 3A:
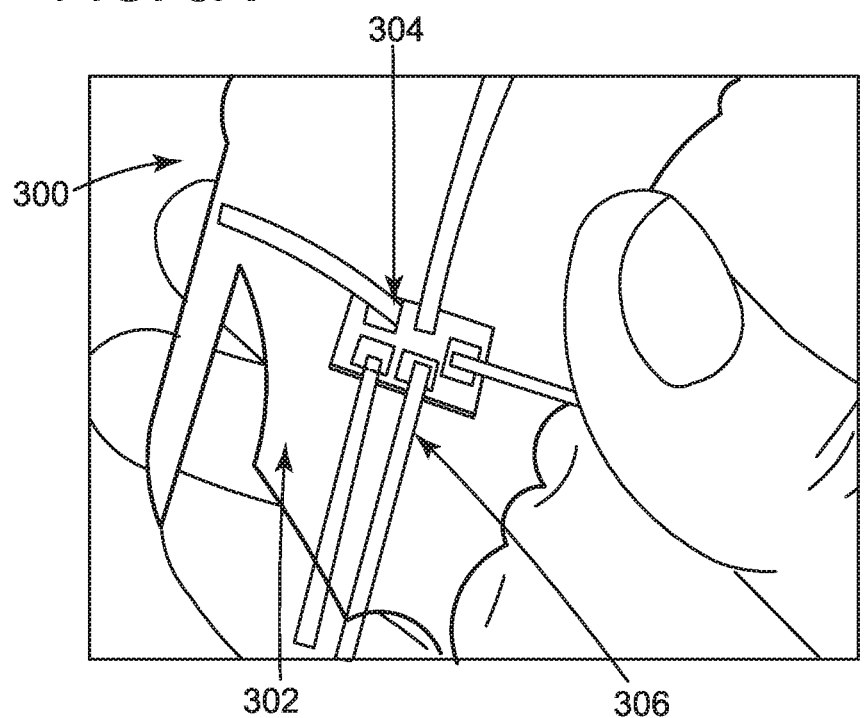
FIG. 3A is an illustration of a packaged flexible electronic device according to one embodiment of the disclosure.
Figure 3B:
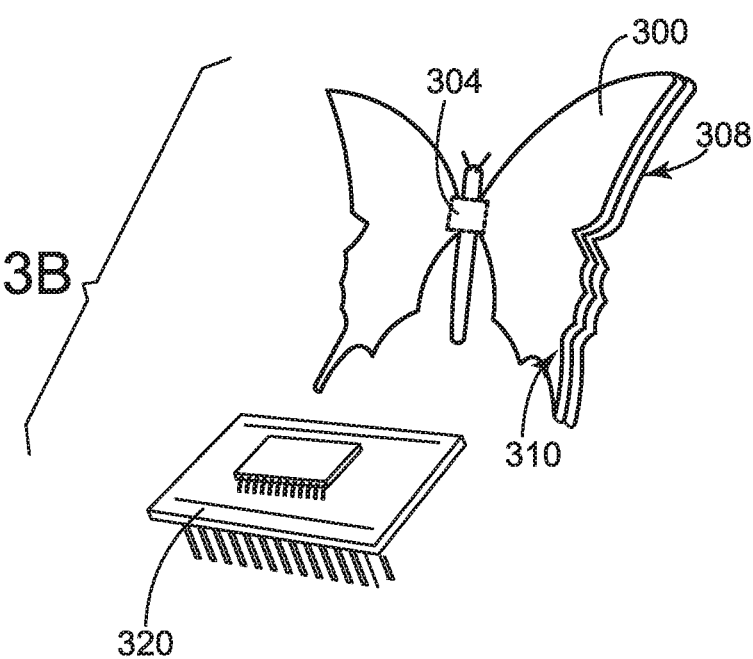
FIG. 3B is an illustration comparing a packaged flexible electronic device according to one embodiment of the disclosure with a conventional rigid electronic device.

One example of a flexible IC in a flexible package is shown in FIGS. 3A-3B. FIG. 3A is an illustration of a packaged flexible electronic device according to one embodiment of the disclosure. A flexible package 300 may include a 3D printed package 302 in the shape of a butterfly, an electronic device 304, and contacts connected to strips 306. The electronic device 304 may be, for example, one of an inverter, a NOR gate, a NAND gate, a buffer, or a combination of any of these. Combinations of these basic components may be used to build more complex circuitry, such as logic circuitry or circuitry for performing arithmetic. The strips 306 may lead from contacts of the device to contact points at the ends of the flexible package 300. The contacts and strips 306 may be used to couple the electronic device 304 on the flexible package 300 to other electronic devices, such as other devices that may be built on other flexible packages and interconnected together. In one embodiment, the electronic device 304 may be fabricated using a ZnO process and the contacts 708 (see FIG. 7) may be fabricated using an Al process.

FIG. 3B is an illustration comparing a packaged flexible electronic device according to one embodiment of the disclosure with a conventional rigid electronic device. The flexible package 300 is shown next to a conventional CMOS electronic device 320. The conventional device 320 is much larger, less flexible, and clearly an electronic device. In contrast the flexible package 300 is smaller, more flexible, and can camouflage the electronic device 304 by appearing as something much more pleasing to the human eye.

Figure 1:
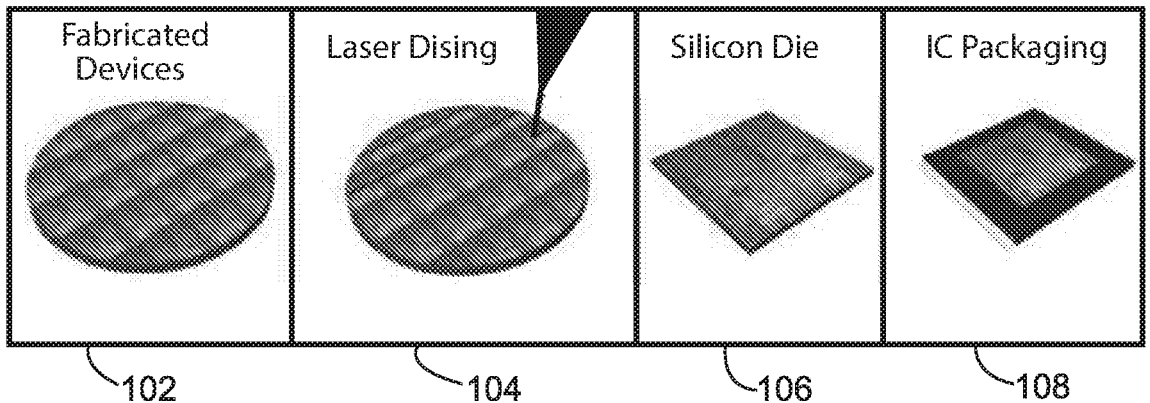
FIG. 1 is a block diagram illustrating conventional manufacturing of electronic devices according to the prior art.

A method for manufacturing flexible packages with flexible devices is shown in FIG. 4. FIG. 4 is a flow chart illustrating one exemplary method for manufacturing a packaged flexible electronic device according to one embodiment of the disclosure. A method 400 may begin at block 402 with fabricating a flexible electronic device 304, such as may be performed according to blocks 102, 104, 106, and 202 of FIG. 1. The flexible electronic device 304 may include an electronic circuit and connections to the circuit. In some embodiments, the electronic circuit may be a sensor, such as a sensor for monitoring an environment around the flexible electronic device or a sensor for monitoring the health of a person wearing the flexible electronic device as a decal. In one embodiment, an electronic circuit of the electronic device may be fabricated with a ZnO process, such as one described in the embodiment of FIGS. 5-6, and the connections to the circuit may be fabricated with an Al process, such as one described in the embodiment of FIGS. 7-8.

Then, at block 404, a first part 308 of a flexible package 300 is fabricated, wherein the flexible package 300 includes space to house the flexible electronic device 304 manufactured at block 402. Next, the flexible electronic device 304 of block 402 may be embedded in the flexible package 300 of block 406. Then, at block 408, a second part 310 of a flexible package 300 may be fabricated to match the first part 308 of the flexible package of block 404. At block 410, the second part 310 of the flexible package 300 may be sealed against the first part 308 to house the electronic device. In some embodiments, the first part 308 and the second part 310 of the flexible package of blocks 404 and 408 may be fabricated separately and joined together at block 410. In some embodiments, the second part 310 may be fabricated at block 408 directly on the first part of the flexible package 300 from block 404 and the sealing of the flexible electronic device of block 410 occurs when sufficient amounts of the second part of the flexible package have been fabricated on the first part.

A size of the flexible package and electronic device fabricated using the method of FIG. 4, or other methods to form decal electronics, may be selected based on an intended use of the electronic device. Compared to RFID stamps, the flexible devices fabricated according to FIG. 4 have complex electronics embedded in them with more functionalities and higher performance Additionally, with increased complexity and data management requirement, the size of the bare die is continuously increasing even with ultra-scaled devices projected for sub-10 nm technology node. The process of FIG. 2 and FIG. 4 make use of semiconductor manufacturing techniques to form portions of the electronic device, and thus the capabilities of a flexible device may match or exceed those of conventional rigid electronic devices. Lastly, the flexibility in wiring (irrespective of whether the wiring is fabricated using inkjet, conductive cellulose, sputtering, etc.) allows the decal electronics to be attached or printed on nearly any surface, which widens the range of applications for the flexible electronic devices. As one example application, a creative innovator or an educator can place the flexible devices as they want and can check the resultant functionality without the need for a conventional breadboard or a PCB to interconnect and support the components.

Figure 5A:
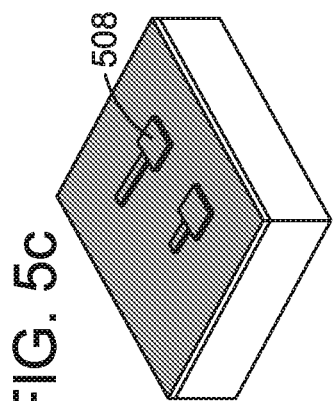
FIGS. 5A-I are perspective views of an electronic device at various stages of manufacturing using a zinc oxide (ZnO) process according to one embodiment of the disclosure.
Figure 5B:
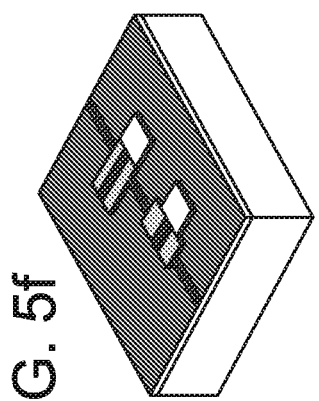
Figure 5C:
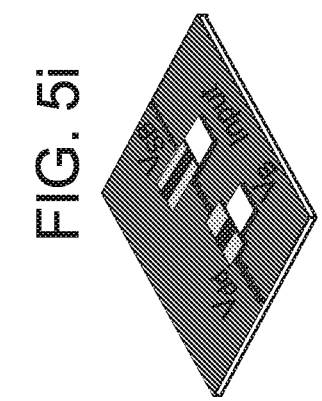
Figure 5D:
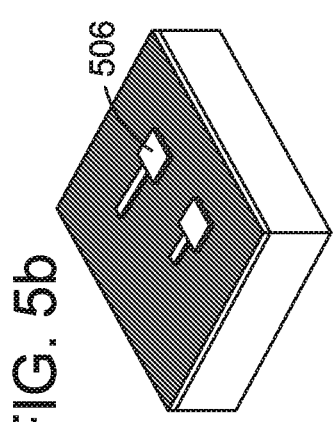
Figure 5E:
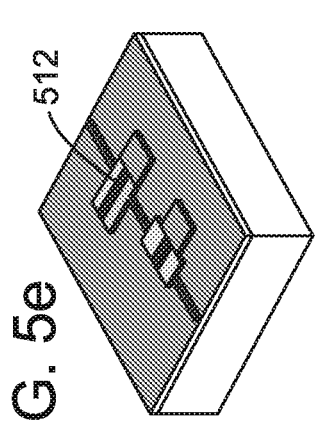
Figure 5F:
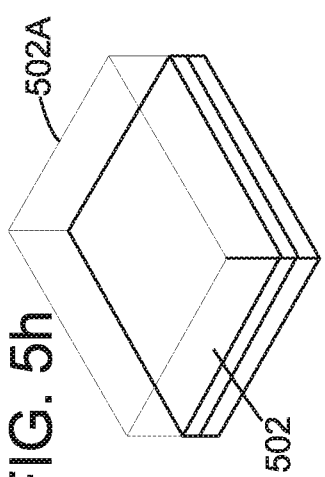
Figure 5G:
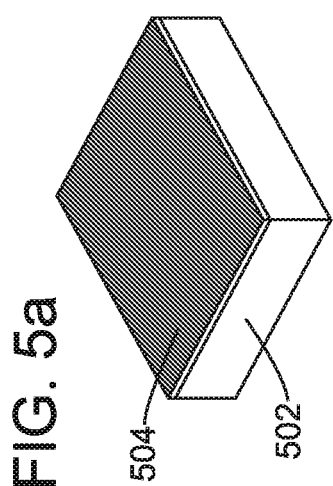
Figure 5H:
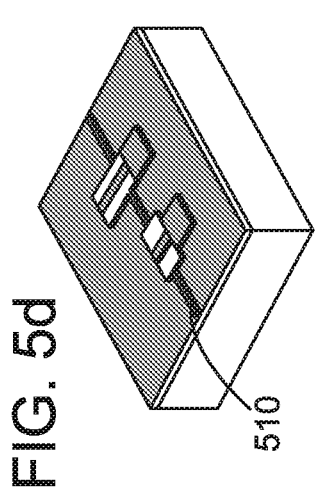
Figure 5I:
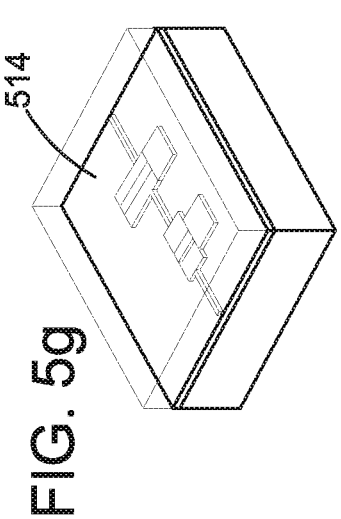
Figure 6:
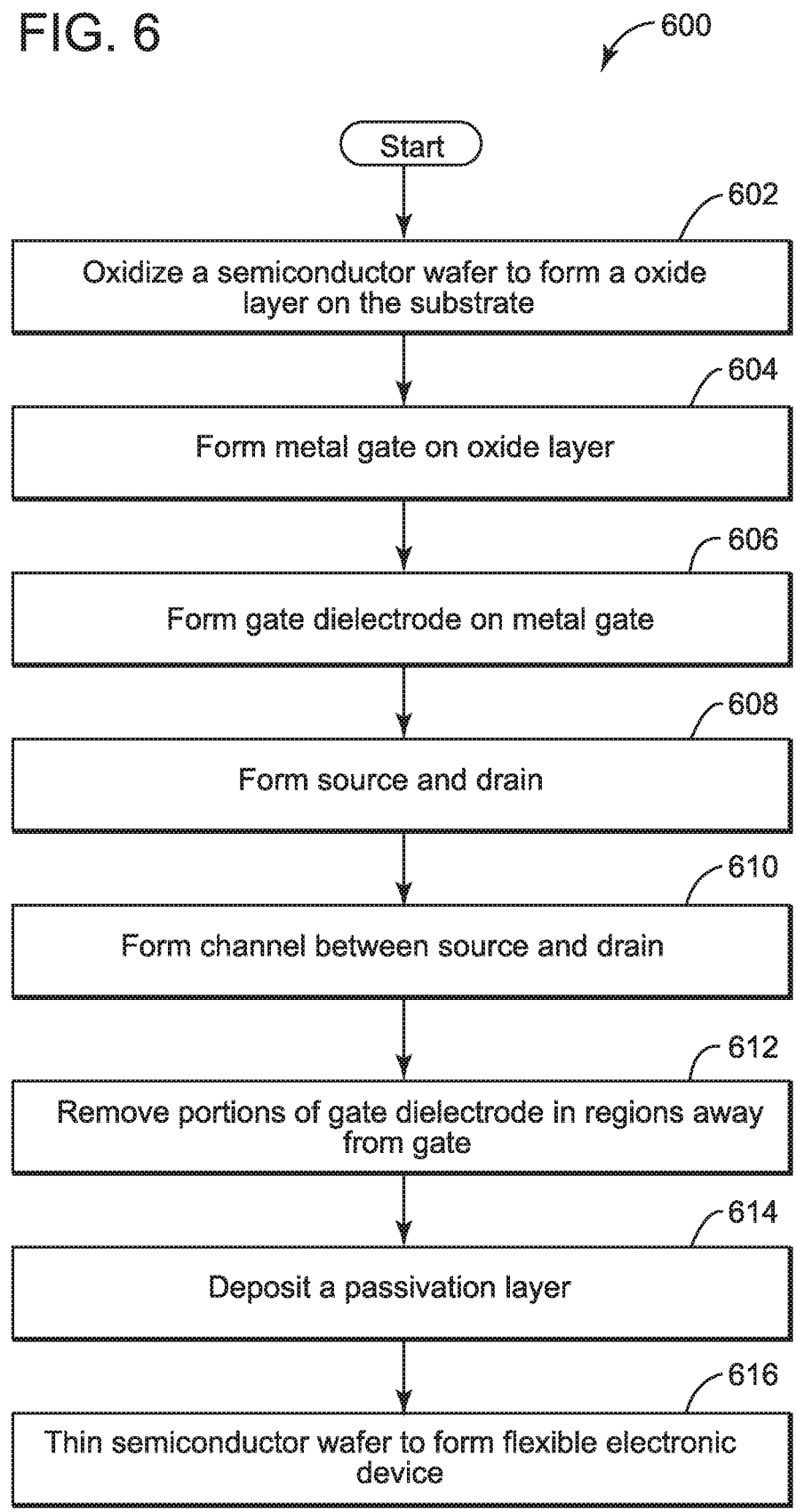
FIG. 6 is a flow chart illustrating one exemplary method for manufacturing using a zinc oxide (ZnO) process according to one embodiment of the disclosure.

One embodiment for manufacturing electronic circuitry for formation of flexible electronic devices is a ZnO process described with reference to FIGS. 5A-I and FIG. 6. FIGS. 5A-I are perspective views of an electronic device at various stages of manufacturing using a zinc oxide (ZnO) process according to one embodiment of the disclosure. FIG. 6 is a flow chart illustrating one exemplary method for manufacturing using a zinc oxide (ZnO) process according to one embodiment of the disclosure. A method 600 begins at block 602 with oxidizing a semiconductor wafer 502 to form oxide layer 504 as shown in FIG. 5A. Next, at block 604, a metal gate 506 may be deposited and patterned as shown in FIG. 5B, such as through lift-off deposition of aluminum or through deposition and mask-based etching of aluminum. At block 606, a gate dielectric 508 may be deposited, as shown in FIG. 5C. In one embodiment, the gate dielectric 508 may be aluminum oxide ($Al_2O_3$). At block 608, source and drains 510 may be deposited on the dielectric layer 508, as shown in FIG. 5D. In one embodiment, the source and drains 510 may be deposited and patterned, such as through lift-off deposition of gold or through deposition and mask-based etching of gold. Next, at block 610, a channel 512 may be deposited and patterned, such as shown in FIG. 5E, such as through lift-off deposition of Zinc oxide (ZnO) or through deposition and mask-based etching of ZnO. Then, at block 612, the dielectric layer 508 may be removed in portions of the substrate to reveal oxide layer 504 as shown in FIG. 5F. Next, at block 614, a passivation layer 514, such as a thick photoresist (PR) may be deposited, such as shown in FIG. 5G. At block 616, the substrate may be flipped and a portion of the substrate 502 etched away to form a flexible electronic device as shown by removing portion 502A of the substrate 502 in FIG. 5H. A final flexible electronic device is shown in FIG. 5I. Although certain materials and implementations of processes are described with reference to the embodiment of FIGS. 5A-I and FIG. 6, other materials and processes may be used to form similar or same flexible electronic device as shown in FIG. 5I.

Figure 7A:
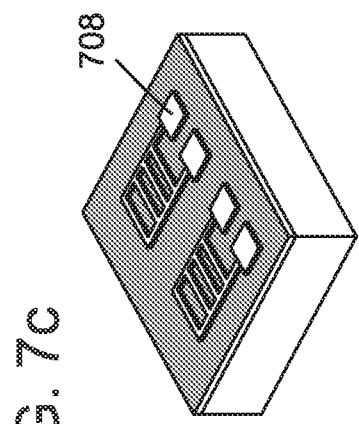
FIGS. 7A-E are perspective views of an electronic device at various stages of manufacturing using an aluminum (Al) process according to one embodiment of the disclosure.
Figure 7B:
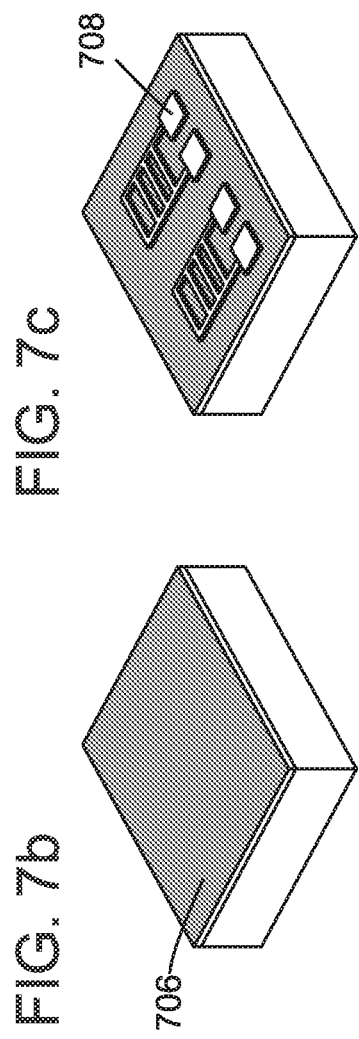
Figure 7C:
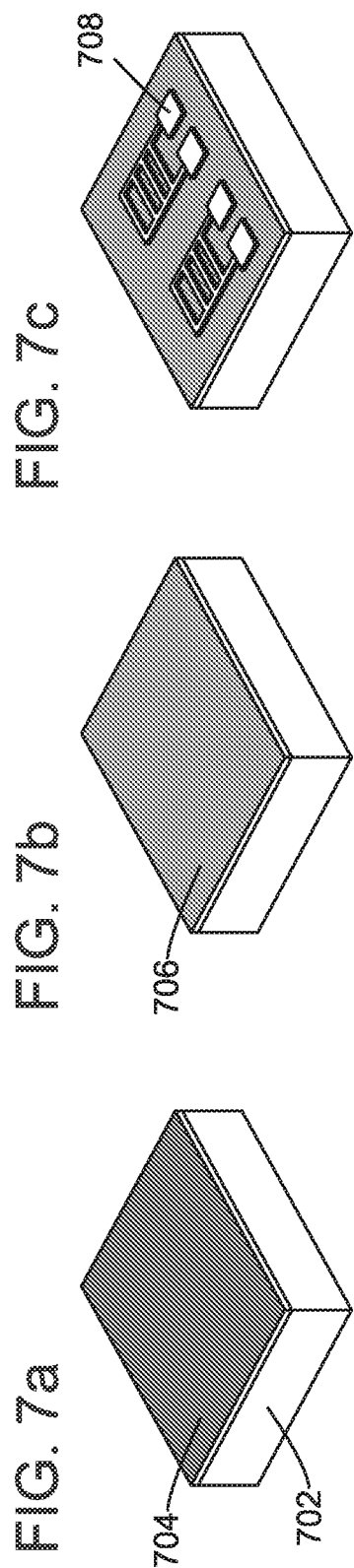
Figure 7D:
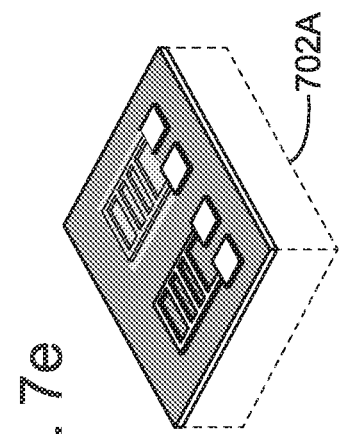
Figure 7E:
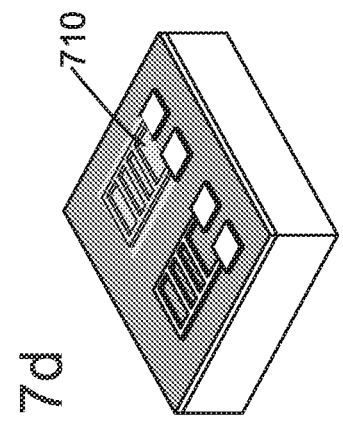
Figure 8:
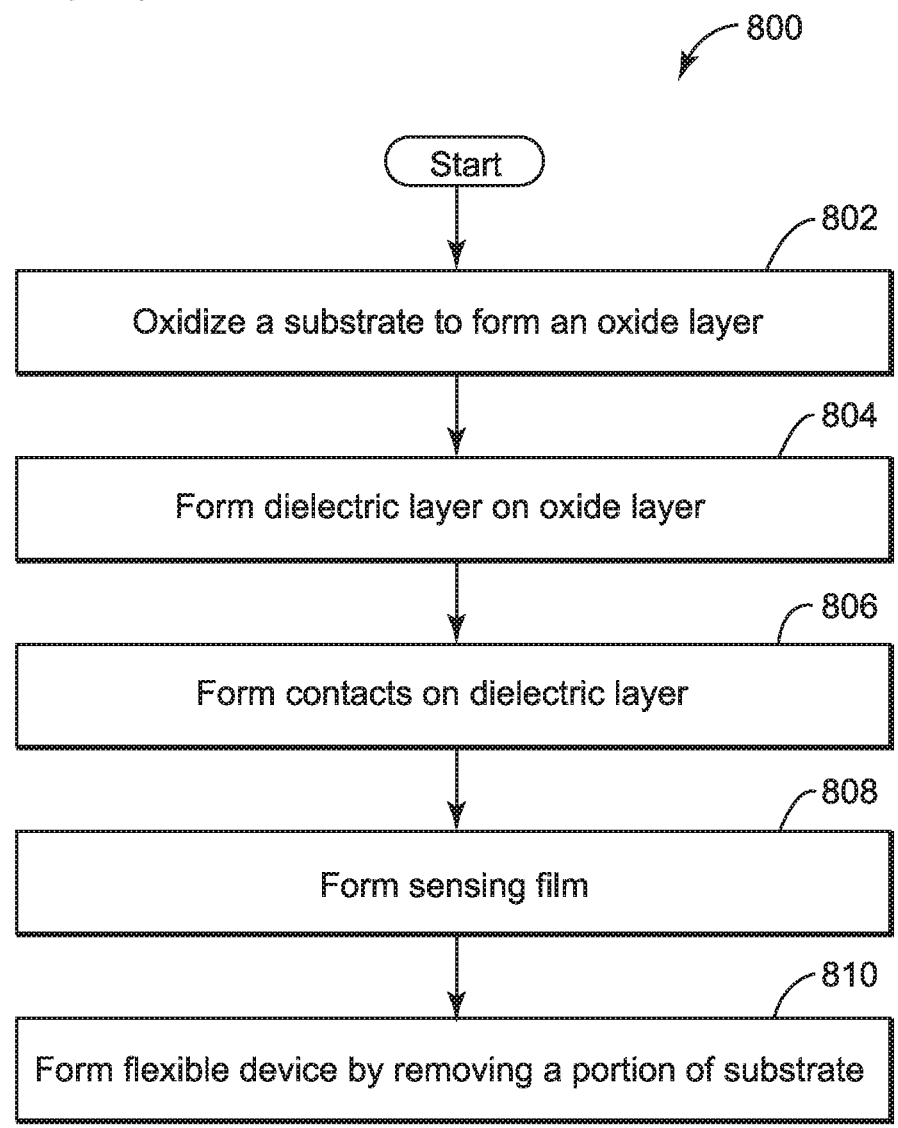
FIG. 8 is a flow chart illustrating one exemplary method for manufacturing using an aluminum (Al) process according to one embodiment of the disclosure.
Figure 9:
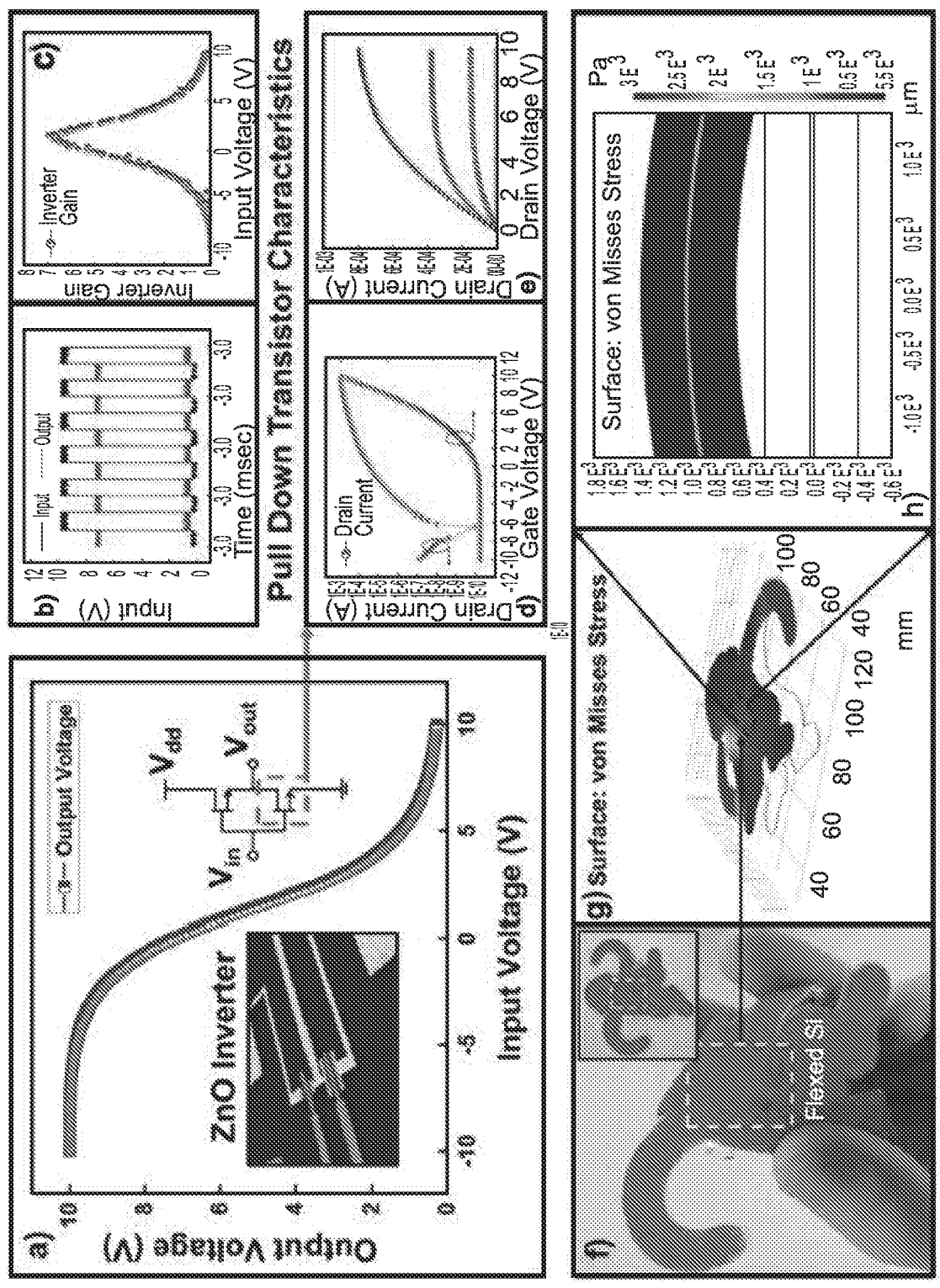
FIGS. 9A-H are illustrations of a flexible packaged electronic device having an inverter according to one embodiment of the disclosure and measured characteristics of the inverter.
Figure 10:
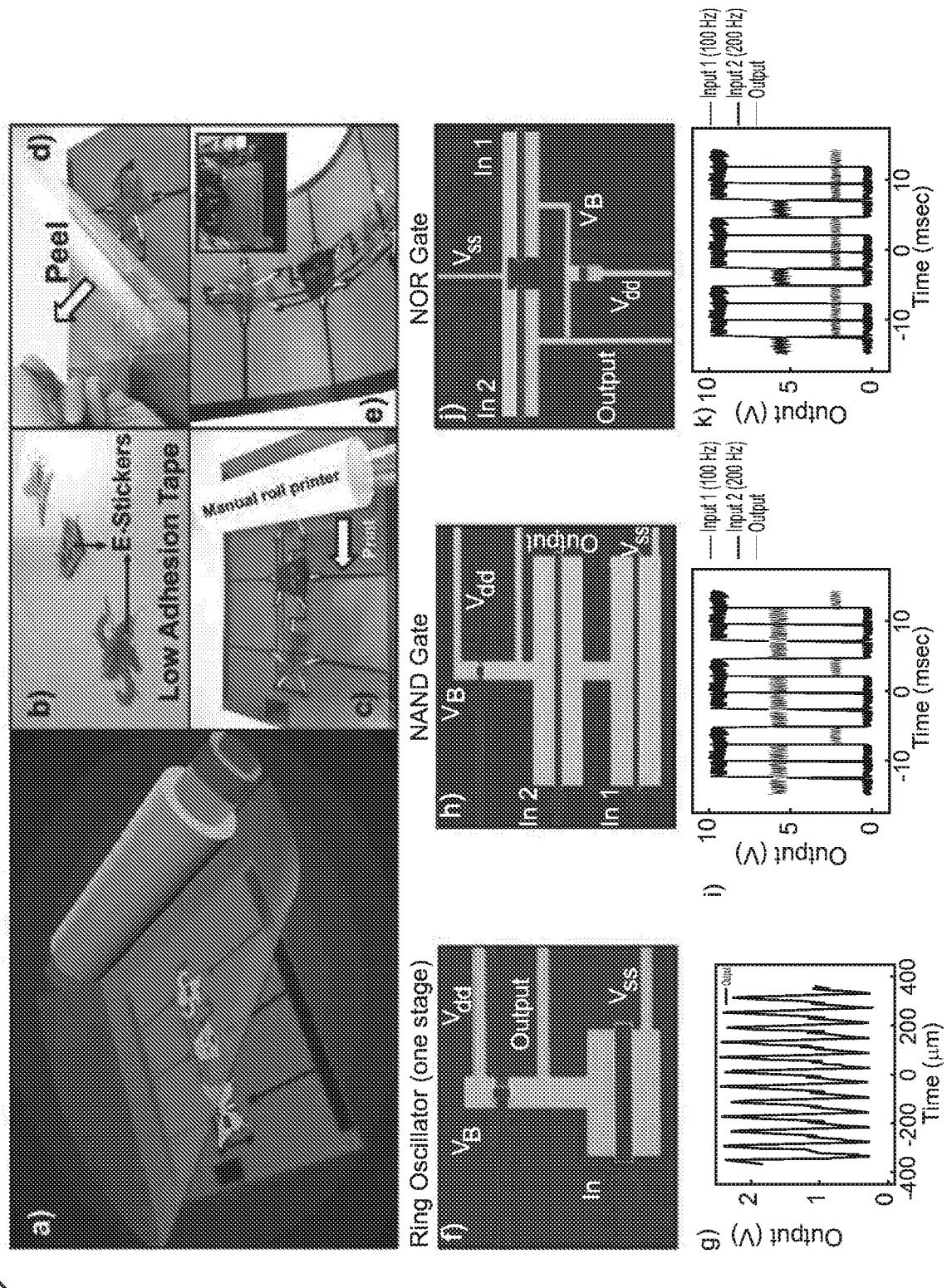
FIGS. 10A-K are illustrations of a flexible packaged electronic device made from multiple decals according to one embodiment of the disclosure and measured characteristics of the decals.
Figure 11:
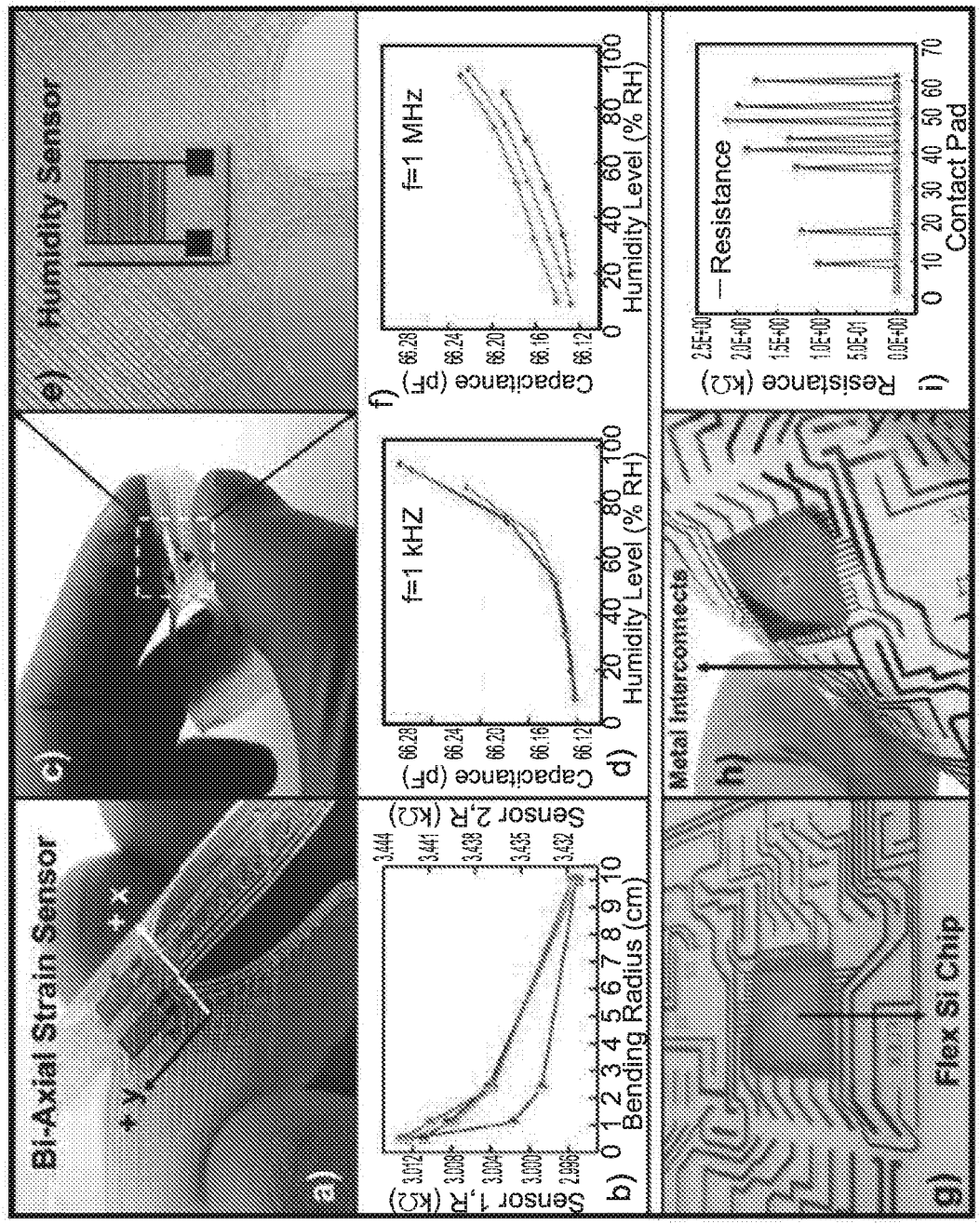
FIGS. 11A-I are illustrations of a flexible packaged electronic device having a bi-axial strain sensor according to one embodiment of the disclosure and measured characteristics of the inverter.
Figure 12:
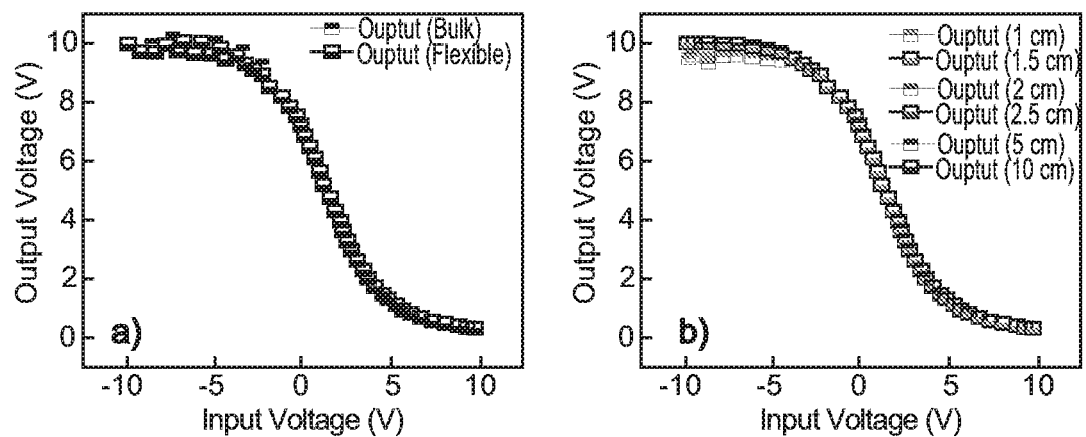
FIGS. 12A-B are graphs illustrating and comparing I-V characteristics of a flexible device having an inverter according to one embodiment of the disclosure and a conventional inverter.
Figure 13:
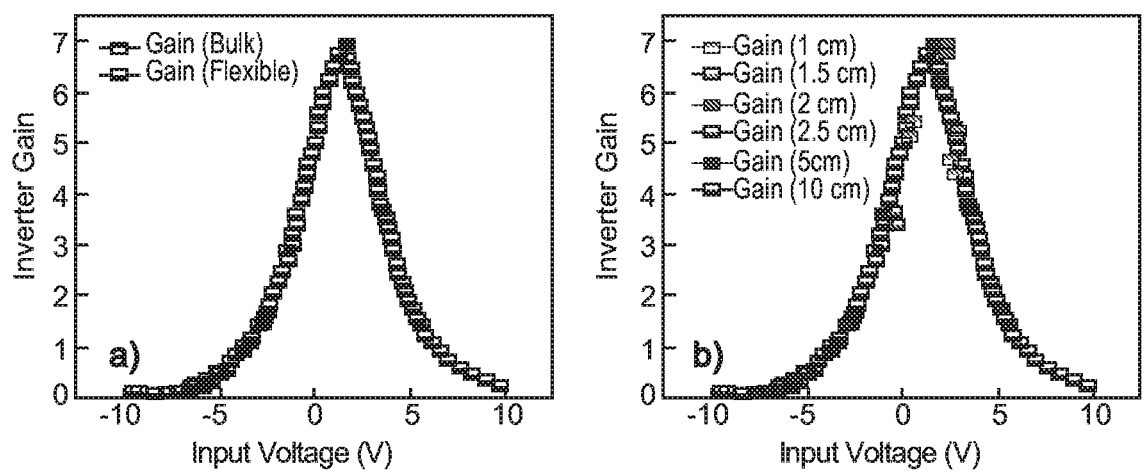
FIGS. 13A-B are graphs illustrating and comparing gain characteristics of a flexible device having an inverter according to one embodiment of the disclosure and a conventional inverter.

One embodiment for manufacturing electronic connections for formation of flexible electronic devices is an Al process described with reference to FIGS. 7A-E and FIG. 8. FIGS. 7A-E are perspective views of an electronic device at various stages of manufacturing using an aluminum (Al) process according to one embodiment of the disclosure. FIG. 8 is a flow chart illustrating one example method for manufacturing using an aluminum (Al) process according to one embodiment of the disclosure. A method 800 begins at 802 with oxidizing a substrate to form an oxide layer 704 on substrate 702, as shown in FIG. 7A. Next at block 804, a dielectric layer 706, such as Polyimide, may be formed on the oxide layer 704, such as shown in FIG. 7B. Then, at block 806, contacts 708 may be formed, such as shown in FIG. 7C, by depositing and patterning or lift-off deposition of Aluminum. Next, at block 808, a sensing film 710, such as Polyimide, is formed over a portion of the contacts 708, as shown in FIG. 7D. The sensing film 710 may be deposited, for example, by spin coat and mask-based patterning. Then, at block 810, a portion of the substrate 702 is removed to form a flexible device, such as by etching to release a top portion of the substrate 702 and connections formed thereon from a bulk portion 702A of the substrate 702, as shown in FIG. 7E.

Performance of electronic devices manufactured as flexible electronics and packaged in flexible packaging may nearly match performance of conventional rigid silicon-based ICs. Some examples of various electronic devices and measured characteristics of those devices are presented in FIGS. 9-17 below.

In physiological (e.g., epidermal), environmental, and organic measurements, noise immunity of the circuits is desired to improve measurement accuracy and signal conditioning of the sensing mechanisms. FIGS. 9A-H are illustrations of a flexible packaged electronic device having an inverter according to one embodiment of the disclosure and measured characteristics of the inverter. FIGS. 9A and 9B show DC and AC characteristics of a fabricated inverter. From the voltage transfer curve (VTC), the switching threshold of the inverter ($V_M$) was calculated to be 2.9 V at the point where $V_{out}=V_{in}$. The obtained values for $V_M$ together with the relative high gains (>6.5) of the inverter shown in FIG. 9C show that the circuits can be used for applications where high noise immunity margins are desired. Here, the inverters are able to process the input signal with strong noise immunity in both high- and low-voltage regions. The fabricated inverters also show an average propagation delay in the range of 21 µs. In digital circuits, switching speed is an important consideration as it can be on factor in dictating the amount of data that can be processed in a given period of time. In the case of these fabricated inverters, the obtained propagation delay shows the fast switching nature of circuit and its potential for use in high performance Internet of Everything analog and digital electronics. Furthermore, results from extended testing show stable performance of the circuit after packaging within flexible 3D printed structures.

Additionally, circuits may use zinc oxide (ZnO)-based transistors with low ON voltages ($V_{ON}$) for low power consumption applications, such as those in wearable and implantable electronics where battery life is a challenging concern due to difficulty in power delivery as well as real time sensing. FIGS. 9D and 9E show the pull down transistor transfer and output curves. The fabricated transistors show effective mobilities ($\mu_{eff}$) in the range of 0.93 $cm^2V^{-1}s^{-1}$, threshold voltage ($V_{th}$) of 1.05 V, subthreshold swings (SS) of 700 mVdec−1, and $I_{ON}/I_{OFF}$ currents ratio of ≈$10^5$. $I_{OFF}$ was calculated by calculating $I_{OFF}$ at $V_{th}$ minus one third of $V_{DD}$. The high ratio between the $I_{ON}$ and $I_{OFF}$ currents show that the transistors are able to provide stable circuits with low stand-by power consumption. In order to provide a complete study on the effects of stress and bending limits of decal electronics, finite element analysis (FEA) was conducted for the final packaged structures and results are shown in FIGS. 9F and 9H. In wearable and implantable electronics, curvature radii far below 3 cm are required to achieve intimate contact between biological tissue and sensing mechanisms. Simulation results show that for a 1.5 cm bending radius, the packaged silicon chips are subjected 0.15 GPa of tensile stress, confirming that the electronic components can survive extreme mechanical bending conditions at a silicon thickness of 40 µm. The vertical position (z-axis) of the electronic chip inside the final packaged structure is of critical importance for reducing mechanical strain on the circuit. In some embodiments, the flexible silicon platform may be embedded close to the neutral axis (center) of the structure in order to reduce the elongation percentage (strain) of the chip when uniaxial or biaxial stress is applied to the system.

Characteristics for other embodiments of electronic devices are shown in FIGS. 10A-K. FIGS. 10A-K are illustrations of a flexible packaged electronic device made from multiple decals according to one embodiment of the disclosure and measured characteristics of the decals. Data acquisition, amplification, and storage are parameters of relatively high importance that should be taken into account during the design of wearable, implantable, and other physiological and/or environmental sensing electronic devices. In some embodiments, this may be achieved with ring oscillators, NAND, and/or NOR universal gates with low-power zinc oxide-based thin film transistors. ZnO-based devices on flexible silicon may have decreased system cost and complexity and industry compatibility with silicon as a host substrate. Performance of the fabricated circuits was tested under extreme bending conditions (e.g., >1.5 cm) to obtain a complete understanding of the capabilities of the circuitry for Internet of Everything applications. A three-stage ring oscillator may be fabricated using emerging additive manufacturing technologies, such as inkjet printing and roll-to-roll printing techniques. In the case of physiological and/or environmental capacitive and resistive sensing, ring oscillators may be used as a readout circuit because the sensor load can introduce a shift in the intrinsic oscillation frequency of the circuit. In one embodiment, a ring oscillator may have an intrinsic oscillation frequency and peak-to-peak voltage ($V_{PP}$) of the circuit of 7 kHz and 2 V, respectively.

In some embodiments, inkjet printing may be fused for interconnecting. The inkjet droplet formation was carefully studied to minimize parasitic drops, which is an important consideration for water-based silver nanoparticle inks. Inkjet droplet formation may be performed with a special pulse-form may include 2 bursts (e.g., 65 μs each) with short trailing retention pulses and a final retention pulse. The obtained drop size for the described pulse-form was found to be approximately 10 pL, but other drop sizes are possible. The nozzle voltage may be set at ±50 V in order to allow correct droplet formation and full range control over the piezoelectric actuator. The printing speed was selected as 0.1 mm/sec in order to allow initial surface wetting and adhesion. The printing speed may be selected, in part, based on expected ink drift on the substrate. Once the drop reaches the substrate, it is necessary to allow enough time for the surface energy of the substrate to decrease to stable levels before new drops are printed. The printing distance from the nozzle to the substrate was set as 9 mm in order to allow precise positioning of the drop on the printed surface.

In current CMOS technology, sequential placing and bonding of ICs is used to produce high-level electronics systems in PCBs. In some embodiments, roll-to-roll printing of silicon and amorphous oxide semiconductor ICs may be used to increase the throughput of manufacturing of electronic systems. By using a low adhesive tape as a temporary host substrate and a manual roll printer as shown in FIGS. 10A-10E, decal electronics may be printed in a parallel fashion on a substrate containing inkjet-printed interconnects. The printing speed and force may be set, in one embodiment, to 1 mm/sec and 50 N, respectively. During roll printing, sufficient force may be applied between the decals and the final substrate in order to allow complete adhesion and prevent the decals from being delaminated from the final substrate during adhesive tape removal. The direction in which the tape is delaminated may impact final decal printing. In one embodiment, removal can be made parallel to the horizontal axis. In another embodiment, delamination may be performed with an inclination of 450 with respect to the horizontal axis of the final substrate to prevent decal delamination. The NAND gates shown in FIGS. 10H and 10I and NOR gates shown in FIGS. 10J and 10K demonstrate the ability of decal electronics to provide complete data storage and processing capabilities in Internet of Everything applications. Characterization of the gates shows low-to-high and high-to-low propagation delays in the range of 28 μs and 25 μs respectively for the NAND gate and 23 μs and 29 μs respectively for the NOR gate. Also, the gates show frequency responses in the range of 200 Hz without performance degradation.

Another embodiment of an electronic device may include a sensor, such as a bi-axial strain sensor. FIGS. 11A-I are illustrations of a flexible packaged electronic device having a bi-axial strain sensor according to one embodiment of the disclosure and measured characteristics of the inverter. Seamless integration of devices and systems for Internet of Everything applications may need reliable, flexible, and stretchable sensing mechanisms that can provide real-time and accurate information about different physiological and environmental processes. Strain and humidity sensors may be fabricated on a flexible polyimide film and embedded in flexible and inexpensive 100 micrometers thick 3D printed packages. One embodiment for strain sensors may be to detect physiological functions, such as breath speed and depth. FIG. 11A shows an aluminum-based bi-axial strain sensor, allowing simultaneous sensing of strain in the y- and x-axis directions. Real-time resistance measurements took place as the decal containing the embedded sensor was bent from 10 to 0.5 cm. As strain is induced in the structure of the decals as shown in FIG. 11B, deformation within the elastic limits of the metallic sensor induces a change in the end-to-end resistance of the sensing resistor. Results show the high sensitivity of the fabricated sensors even at extreme bending conditions with a change of resistance in sensor 1 from 2.996 kΩ to 3.11 kΩ for 10 cm and 0.5 cm bending radii respectively for the x-axis, and from 2.996 kΩ to 3.12 kΩ for 10 cm and 0.5 cm bending radii respectively in the y-axis. Sensor 2 shows a change in resistance from 3.432 kΩ to 3.443 kΩ for 10 cm and 0.5 cm bending radii respectively in the x-axis, and from 3.432 kΩ to 3.442 kΩ for 10 cm and 0.5 cm bending radii respectively in the y-axis direction.

Humidity sensors, as shown in FIGS. 11C and 11E, can be used to detect different sweat levels of highly active persons, such as athletes and soldiers. In some embodiments, the sensors may be worn on clothing to provide accurate information about the activity levels and real time diagnostics for health professionals. We have studied the behavior of the fabricated humidity sensors by exposing them to different values of known relative humidity (RH) levels ranging from a dry controlled environment (10% RH) to a controlled high-humidity environment based on water vapor (97% RH). As water molecules get absorbed in the polyimide film, capacitance of the sensor increases due to a change in the relative permittivity of the structure. In this sense, the capacitance changes according to different values of RH levels. We have noticed that the capacitance change (ΔC) follows an exponential response for low operation frequencies (1 kHz) as shown in FIG. 11D and a linear response in the case of high operation frequencies (1 MHz) as shown in FIG. 11F due to the moisture capacity and diffusion resistance of the sensing material and the air surrounding the sensors.

Depending on the application, the operation frequency of the sensor can be selected with some tradeoffs in terms of sensitivity and linearity. In the case of low operation frequencies, the sensors exhibit larger sensitivities, in the range of 2 to 22 fF/% RH, than the sensors operated at high frequencies, which exhibit sensitivities in the range of 1 to 1.7 fF/% RH. However, sensors at high frequencies exhibit a better linearity in the response with respect to the RH value, in this sense, calibration of the sensor is easier for high operation frequencies.

In free-form electronics, contact and test pad formation is one of the highest concerns in the field due to challenges such as increased contact resistance and contact break between flexible chips and input and output pins. FIGS. 11G and 11H show one embodiment of an interconnection method for very large scale integration (VLSI) of flexible electronics. A 61-pin flexible silicon bare die chip may create an electronic system on a flexible sheet such as Polyimide. Polyimide was chosen due to inherited flexibility and advantages over flexible PCBs. Advantages when compared to FPCBs include extreme bending radii (below 3 cm), low cost, ease of fabrication, high temperature (300° C.) compatibility, and specially due to elastic moduli which allows intimate contact with isometric surfaces for future IoE devices. The connections between the bonded chip and the flexible circuit board show resistances in the range of mΩ for most of the contact pads as shown in FIG. 11I.

Another embodiment of a flexible electronic device may include an inverter. FIGS. 12A-B are graphs illustrating and comparing I-V characteristics of a flexible device having an inverter according to one embodiment of the disclosure and a conventional inverter. FIG. 12A illustrates a VTC characteristics comparison between bulk and flexible ZnO-based inverter. FIG. 12B illustrates a VTC characteristics comparison for flexible ZnO-based inverter at different bending radii. As shown in FIGS. 12A-B, the conventional bulk and flexible devices of this disclosure share nearly identical characteristics, thus allowing the flexible electronic devices to offer similar performance as conventional rigid electronic devices.

FIGS. 13A-B are graphs illustrating and comparing gain characteristics of a flexible device having an inverter according to one embodiment of the disclosure and a conventional inverter. FIG. 13A illustrates gain comparison between bulk and flexible ZnO-based inverters. FIG. 13B illustrates gain comparison for flexible ZnO-based inverter at different bending radii. As shown in FIGS. 13A-B, the conventional bulk and flexible devices of this disclosure share nearly identical characteristics, thus allowing the flexible electronic devices to offer similar performance as conventional rigid electronic devices.

Figure 14A:
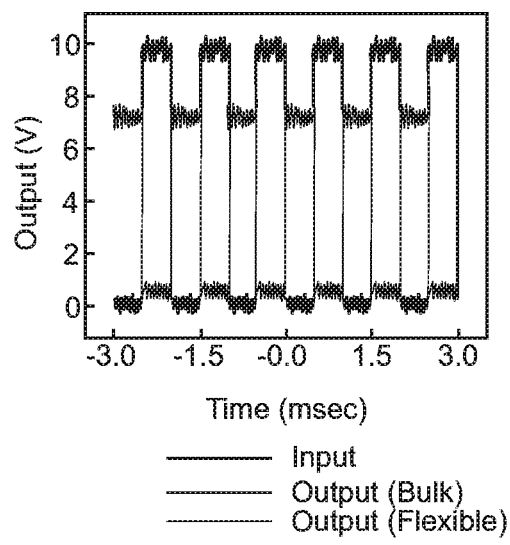
FIGS. 14A-B are graphs illustrating and comparing AC response characteristics of a flexible device having an inverter according to one embodiment of the disclosure and a conventional inverter.
Figure 14B:
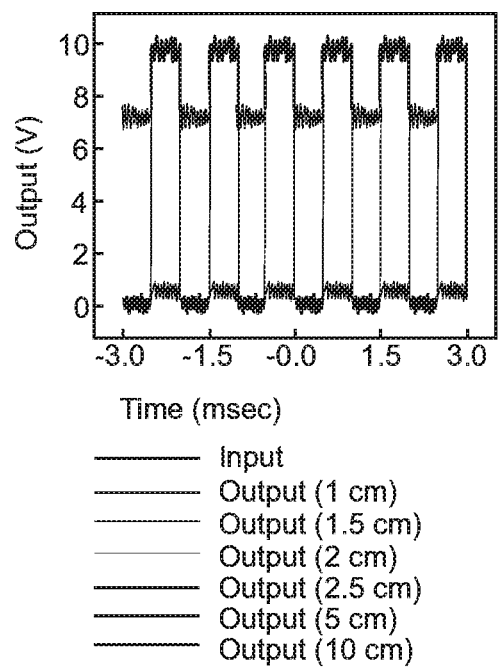

FIGS. 14A-B are graphs illustrating and comparing AC response characteristics of a flexible device having an inverter according to one embodiment of the disclosure and a conventional inverter. FIG. 14A illustrates an AC response comparison between bulk and flexible ZnO-based inverters at f=1 kHz. FIG. 14B illustrates an AC response comparison for flexible ZnO-based inverter at different bending radii at f=1 kHz. As shown in FIGS. 14A-B, the conventional bulk and flexible devices of this disclosure share nearly identical characteristics, thus allowing the flexible electronic devices to offer similar performance as conventional rigid electronic devices.

Figure 15A:
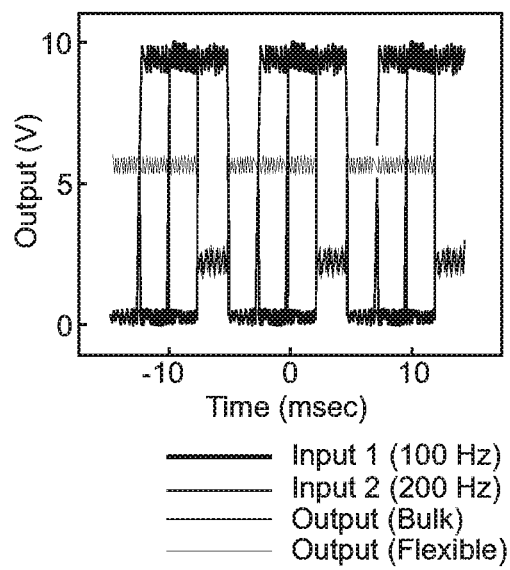
FIGS. 15A-B are graphs illustrating and comparing AC response characteristics of a flexible device having a NAND gate according to one embodiment of the disclosure and a conventional inverter.
Figure 15B:
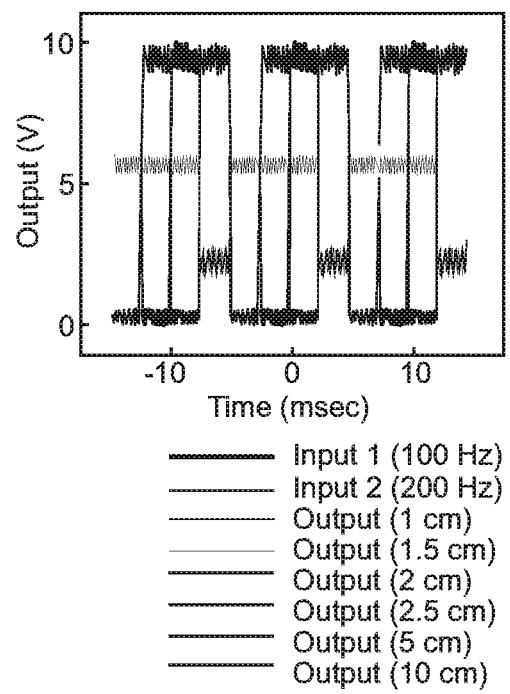

FIGS. 15A-B are graphs illustrating and comparing AC response characteristics of a flexible device having a NAND gate according to one embodiment of the disclosure and a conventional inverter. FIG. 15A illustrates an AC response comparison between bulk and flexible ZnO-based NAND gates. FIG. 15B illustrates an AC response comparison for flexible ZnO-based NAND gate at different bending radii. As shown in FIGS. 15A-B, the conventional bulk and flexible devices of this disclosure share nearly identical characteristics, thus allowing the flexible electronic devices to offer similar performance as conventional rigid electronic devices.

Figure 16A:
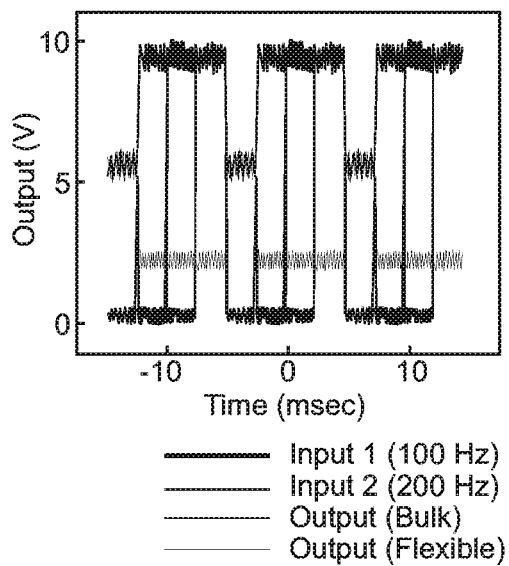
FIGS. 16A-B are graphs illustrating and comparing AC response characteristics of a flexible device having a NOR gate according to one embodiment of the disclosure and a conventional inverter.
Figure 16B:
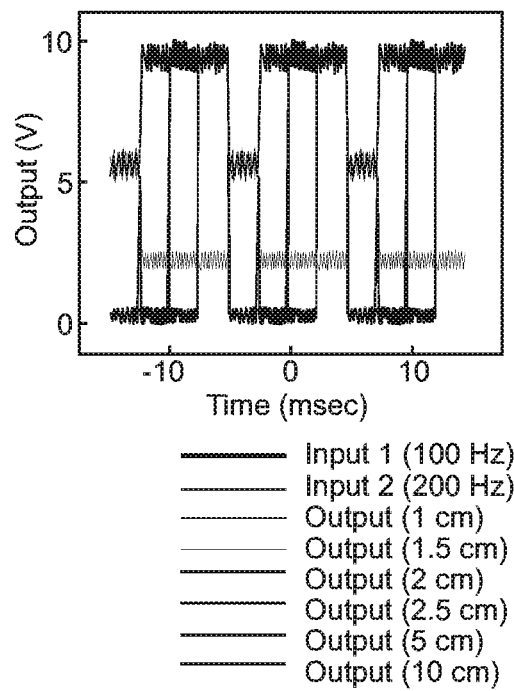

FIGS. 16A-B are graphs illustrating and comparing AC response characteristics of a flexible device having a NOR gate according to one embodiment of the disclosure and a conventional inverter. FIG. 16A illustrates an AC response comparison between bulk and flexible ZnO-based NOR gates. FIG. 16B illustrates an AC response comparison for a flexible ZnO-based NOR gate at different bending radii. As shown in FIGS. 16A-B, the conventional bulk and flexible devices of this disclosure share nearly identical characteristics, thus allowing the flexible electronic devices to offer similar performance as conventional rigid electronic devices.

Figure 17:
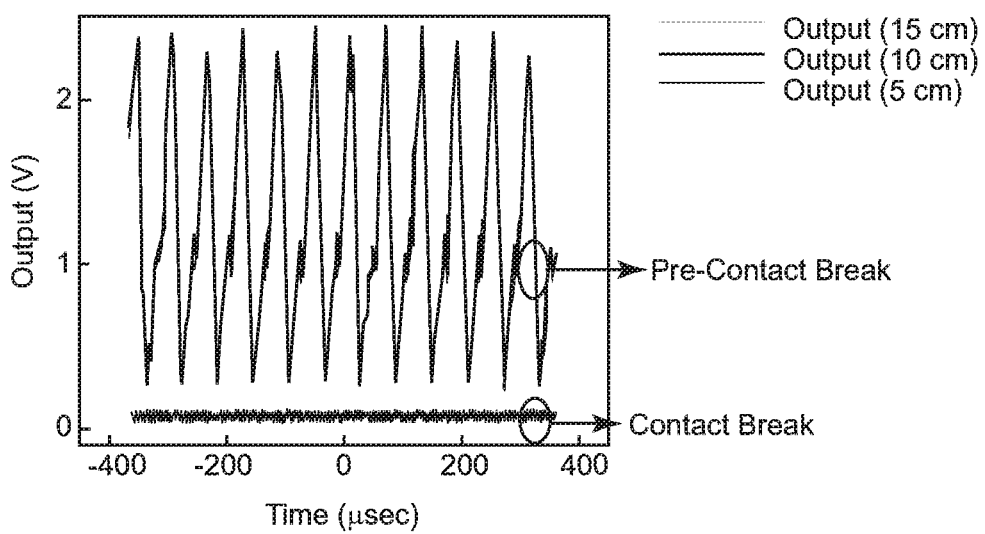
FIG. 17 is graphs illustrating and comparing RO response characteristics of a flexible device according to one embodiment of the disclosure and a conventional inverter.

Additional data regarding the flexible electronic devices is shown in FIG. 17. FIG. 17 includes graphs illustrating and comparing RO response characteristics of a flexible device according to one embodiment of the disclosure and a conventional inverter.

In embodiments of this disclosure, a combination of CMOS technology-compatible flexing of CMOS electronics, inkjet printing, and conductive cellulose for interconnecting, 3D printing for packaging, and roll-to-roll printing of decal electronic systems are combined to devise a high-throughput manufacturable system embodying batch processing for wide deployment of new age sleek consumer electronics for integration with asymmetric surfaces commonly available in natural species. The decal flexible electronic systems show uncompromising electrical performance, large-scale-integration density, and functionality under extreme mechanical conditions. The fabrication process is simple, affordable, and reliable. Some embodiments of the flexible electronic devices described above include use in future Internet of Everything (IoE) electronics to produce highly complex physically flexible stretchable-reconfigurable consumer electronics systems at reduced costs and production times while preserving the advantages provided by CMOS technology for data processing and storage.

Some embodiments of manufacturing methods and testing methods are described in further detail below. In one embodiment, circuit fabrication begins with standard silicon (Si) (100) wafers. First, 500 nm thermal silicon dioxide ($SiO_2$) is grown in order to isolate the ZnO devices from the host wafers. Then, the gate metal is deposited using aluminum sputtering (e.g., at Power: 400 W; time: 600 seconds; pressure: 5 mTorr; pre-sputtering time: 100 seconds; gas: 25 sccm Ar) to achieve a thickness of 200 nm. Then, the gate metal is patterned using standard photolithography and wet etching. Next, the wafers are cleaned using acetone, isopropyl alcohol, and plasma ashing. Then, 40 nm $Al_2O_3$ are deposited on top of the wafer using atomic layer deposition (ALD) with a deposition rate of 1 Å per cycle at a temperature of 300° C. Next, the source and drain contacts are patterned using lift-off technique and a deposition of 10 nm/200 nm of chrome/gold (Cr/Au) on top of the wafers using sputtering (e.g., Chrome at: Power: 400 W; time: 80 seconds; pressure: 5 mTorr; pre-sputtering time: 10 seconds; gas: 25 sccm Ar; and Gold at: 400 W; time: 200 seconds; pressure: 5 mTorr; pre-sputtering time: 10 seconds; gas: 25 sccm Ar). Next, 40 nm ZnO are deposited on top of the wafers using ALD at a temperature of 100° C. in order to allow enough oxygen vacancies to be present in the semiconducting film and enhance the performance of the TFTs. Following this, photolithography is performed on the wafers to pattern the channel of the devices and the gate dielectric. Then, the ZnO and $AlO_2$ films are patterned using diluted hydrofluoric acid (10:1 dilution for 5 seconds) and reactive ion etching (30 seconds in $CHF_3$ and Ar plasma), respectively. A 40 nm low-temperature (100° C.) $Al_2O_3$ is deposited on top of the wafers as passivation layer for the fabricated devices. Finally, the passivation layer is removed from the test pads to allow ohmic contact between the aluminum-based interconnects and the pads.

In one embodiment, sensor fabrication may start with standard Si (100) wafers. First, 300 nm thermal $SiO_2$ are grown on top of the wafers in order to allow peeling of future films from the host substrate. Then, 10 μm polyimide is spin-coated on top of the wafers with a speed of 3000 rpm. Next, the polyimide film is cured at 350° C. for 30 minutes. Afterwards, the sensor metal is deposited on top of the cured films using Al sputtering (e.g., at Power: 400 W; time: 900 seconds; pressure: 5 mTorr; pre-sputtering time: 100 seconds; gas: 25 sccm Ar) to target a thickness of 300 nm. Finally, the polyimide film is removed from the host Si substrate by simply peeling the polymer from the wafers. At this point, the sensors are diced and the remaining Si wafer can be recycled for future fabrication processes.

In one embodiment, circuit flexing may include, first, dicing the wafers using a semi-automated diamond tip dicing saw to allow processing of single dies. Next, each die is coated with thick photoresist (7 μm) to protect the front part of the devices during future back etching steps. Next, the dies are mounted upside down on top of a carrier wafer with thermal oil and are processed using BOSCH process (regenerative reactive ion etching process) at a temperature of −20° C. The flexing process is performed in 4 different etch steps. The first step reduces the thickness of the dies from 500 μm to 200 μm in a single etch step. Next, the dies are cleaned and coated with fresh PR to prevent permanent PR adhesion of to the dies due to the low processing temperatures. Then, the dies are processed in 3 more etch steps that reduce 55 μm each until the required silicon thickness is obtained (<50 μm). In between each etch step mechanical and optical profilometer measurements are performed in order to confirm the substrate thickness and prevent over etching of the devices. Finally, the dies are cleaned to remove the PR and are ready to be flexed below 1.5 cm.

In one embodiment, 3D printed packaging and embedding may include, first, the decals are designed using SolidWorks CAD software. The sensor decals are designed using a meshed structure with a separation between lines of 100 μm in order to allow the sensors to have intimate contact with the sensing surfaces. The electronics decals are designed using a solid model in order to prevent environmental factors from damaging the performance of the fabricated devices. Next, the decals are printed on a 3D printer. The electronics and sensor decals are printed in two steps in order to allow embedding of the devices inside the structure of the 3D printed package. In the case of sensors, the first layer consists of 100 μm of meshed flexible polymer (PLA) while for electronics the first layer consists of 300 μm solid flexible polymer. Afterwards, the first layer is printed the 3D printer is paused and the devices are embedded into the structure by placing a 3M high temperature adhesive tape on the back of the devices. Then, the printed Al foil strips are bonded to the circuit testing pads with silver epoxy in order to allow good electrical contact and low contact resistance. Next, the printing process is resumed and the second layer prints the remaining of the package on top of the embedded devices. Extra protection may be provided during embedding of ZnO circuits to prevent the high temperature polymer (210° C.) from damaging the devices. In some embodiments, the decals were designed with a small cavity (e.g., 100 μm height) in the zone where the active part of the devices is located.

In one embodiment, ring oscillator printing may include, first, printing a green background on a standard A4 photography level glossy paper. Next, the paper is loaded into the inkjet printer and the interconnections are printed using silver nanoparticles based ink. The inkjet printing is done using a 50 μm piezoelectric nozzle and the drops are optimized using a pulse developer. The printing pulse consists of 2 main bursts for 65 μs with short trailing retention pulses and a final retention pulse. The drop size was found to be 10 pL. for an operation voltage of the nozzle at ±50 V. The printing speed was selected as 0.1 mm/sec. The final resolution of the inkjet-printed lines may be 400 μm. The ink is cured at 120° C. to reduce the resistance of the inkjet-printed film and allow reliable interconnections between the fabricated electronic decals. Then, the decals are placed upside down on top of a low adhesion tape as a temporary substrate. Then, the decal system is printed on top of the inkjet-printed substrate using a manual roll printer with a speed of 1 mm/sec and a printing force of 50 N in order to allow complete adhesion between the decals and the final host substrate. Finally, the temporary low adhesion tape is removed from the final substrate by simply peeling it at an angle of 45° with respect of the horizontal axis of the substrate.

In one embodiment, flexible TFTs may be tested using a semiconductor analyzer and a probe station. First, the transfer characteristics of the transistors are measured by sweeping the gate voltage from −10 to 10 V while keeping the drain voltage at 10 V and measuring the drain current ($I_d$). Then, the output transfer curves are obtained by sweeping the drain voltage from 0 to 10 V for each gate voltage step (−5 to 10 V with step size of 5 V).

In one embodiment, the fabricated devices were tested in three different configurations. First, the devices are tested in bulk (before flexing) using a semiconductor analyzer and a probe station. Then, the devices are tested after BOSCH processing (flexible) and finally after embedding the devices in the 3D printed package. In the case of the inverter, the VTC was obtained by setting the $V_{dd}$ voltage to 10 V, the bias voltage ($V_B$) to 10 V, and the input voltage is swept from −10 to 10 V while measuring the output voltage. Then, the inverters are connected to an AC signal generator with a frequency of 1 kHz and a peak-to-peak voltage ($V_{pp}$) of 10 V and the output waveform is measured with an oscilloscope. In the case of the NAND and the NOR gates, the output curves are obtained by using a dual output waveform generator with a $V_{pp}$ of 10 V and two different frequencies (100 Hz and 200 Hz) while measuring the output voltage of the fabricated circuits using an oscilloscope. Performance measurements of the flexible circuits were measured for different bending radii (e.g., 1, 1.5, 2, 2.5, 5, and 10 cm) before and after embedding in the 3D printed packages.

In one embodiment, the decals containing the embedded strain sensors are subject to bending tests while measuring the end-to-end resistance of the sensor. The measurements are carried out using a semiconductor analyzer to obtain the resistance with respect of time while the sensor is bent from flat to the different bending radii (0.5, 1, 2.5, and 10 cm). In the case of the humidity sensors, the capacitance of the embedded sensors is first measured in a controlled environment (22° C. and 10% RH) in order to obtain the initial value. The humidity characterization setup contains paths for water vapor, for which the concentration can be accurately regulated by adjusting the flow rate through mass flow controllers (MFCs). The test cell, e.g., the humidity chamber, is connected to an LCR meter and a multimeter through BNC electrical connectors. Paths for vacuum pump and a humidifier (bubbler) are connected to the test cell through controlling valves and MFCs, with flow rates up to 200 mL/min for the bubbler path. A path of dry $N_2$ is also used for purging the chamber. The vapor is generated through the flow of nitrogen inside the bubbler creating an air-water mixture. The ratio of the partial pressure of water vapor in the mixture to the saturated vapor pressure of water at ambient temperature is the relative humidity (RH %). The water vapor mixture reaches the testing chamber through a mass flow meter. The chamber contains two sensors: a commercial humidity sensor and our fabricated sensor. The commercial sensor is used as a reference to measure the humidity levels inside the chamber. Then, the output voltage of the commercial sensor is measured through the multimeter, while capacitance changes in our fabricated sensor are measured using the connected LCR meter. Then, both the Multimeter and LCR meter are interfaced to software through a GPIB to USB cable. Thus, data acquisition and collection is automated through software. For the humidity testing of the sensor, we perform data acquisition using purging cycles, which means in between every step of changing RH levels, we purge the chamber. In this case, the % RH was varied by changing the carrier flow of the bubbler's inlet and dilution of dry $N_2$. This purge experiment was repeated three times to prove the reproducibility of the results.

In one embodiment, fabrication of flexible circuit boards with bonded flexible silicon chips may include, first, fabricating a silicon chip using mask-less lithography (e.g., laser patterning) with a positive photoresist. Next, 10 nm/150 nm Cr/Au are sputtered on top of the wafer and patterned using lift-off technique. Then, 10 nm/150 nm Cr/Au are sputtered on top of $O_2$ plasma treated polyimide sheet (100 μm thick) to enhance adhesion between the sputtered metal and the polyimide surface. Then, the substrate is spin coated with photoresist (PR) and patterned using standard wet Au etching (for 1 min) and wet Cr etching (for 20 sec). Next, the PR is removed using acetone and IPA. Then, the silicon chip is flexed using the same procedure described in the circuit flexing section. Next, the flexible PCB and the flexible chip are mounted on a flip-chip bonding machine (in order to allow correct alignment of the pads in the silicon sample and the contacts in the flexible PCB. Next, Ag-based epoxy is dispensed on top of the contact pads of the circuit board using the automated feature of the bonding tool to prevent circuit shorting. Finally, the chip is flip-chip bonded to the board pads using a dual camera system which allows correct alignment of the bonding pads.

The schematic flow chart diagrams of FIG. 2, FIG. 4, FIG. 6 and FIG. 8 and the other methods described above are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown. Similarly, references to a first part and a second part are for understanding. For instance, references to a first part and a second part may be, e.g, reversed.

Although the present disclosure and certain representative advantages have been described in detail, it should be understood that various changes, substitutions and alterations can be made herein without departing from the spirit and scope of the disclosure as defined by the appended claims. For example, although 3D printing is described throughout the application, manufacturing methods described herein and resulting apparatuses may be produced through any additive manufacturing technique. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for fabricating a flexible electronic decal, comprising:
fabricating a flexible electronic device, wherein the step of fabricating the flexible electronic device comprises fabricating circuitry with semiconductor processing and fabricating contacts with conductor processing;
fabricating a first part of a flexible package to house the flexible electronic device;
embedding the flexible electronic device in the first part of the flexible package;
fabricating a second part of the flexible package to house the flexible electronic device; and
sealing the flexible electronic device in the flexible package using the second part of the flexible package,
wherein the step of fabricating the flexible electronic device comprises:
oxidizing a semiconductor wafer to form an oxide layer on a substrate layer;
depositing and patterning a metal gate on the oxide layer;
depositing a gate dielectric layer on the metal gate;
depositing a source and drain on the dielectric layer to sandwich the metal gate;
depositing and patterning a channel on the metal gate, between the source and drain;
removing the dielectric layer to reveal the oxide layer;
depositing a passivation layer over the source, drain, and channel; and
removing at least a portion of the substrate layer.

2. The method of claim 1, in which the step of fabricating the second part of the flexible package comprises printing the second part onto the first part of the flexible electronic device using a 3D printer, in which the printing step also seals the flexible electronic device in the flexible package.

3. The method of claim 1, in which the step of sealing the flexible electronic device comprises attaching the second part of the flexible package to the first part of the flexible package to encase the flexible electronic device.

4. The method of claim 1, in which the flexible electronic device comprises at least one of a NAND gate, NOR gate, inverter, and buffer.

5. The method of claim 1, in which the flexible electronic device comprises a flexible sensor.

6. The method of claim 1, in which the flexible electronic device comprises a ring oscillator.

7. The method of claim 1, in which the step of fabricating a first part of the flexible package comprises printing a first layer of a decal using a 3D printer.

8. The method of claim 1, in which the step of embedding the flexible electronic device in the first part of the flexible package comprises placing the flexible electronic device in a cavity in the first part of the flexible package and bonding a plurality of flexible conductive strips to a plurality of contacts of the flexible electronic device.

9. The method of claim 8, wherein the plurality of flexible conductive strips are formed using one or more of inkjet printing, conductive cellulose, and sputtering.

10. The method of claim 1, in which the electronic device comprises circuitry and contacts.

11. The method of claim 10, wherein the semiconductor processing comprises performing a ZnO process and the fabricating of contacts comprises performing an Al process.

12. The method of claim 1, in which at least one step of the fabricating of the flexible electronic decal is performed with roll-to-roll printing.

13. A method for fabricating a flexible electronic decal, comprising:
fabricating a flexible electronic device, wherein the step of fabricating the flexible electronic device comprises fabricating circuitry with semiconductor processing and fabricating contacts with conductor processing;
fabricating a first part of a flexible package to house the flexible electronic device;
embedding the flexible electronic device in the first part of the flexible package;
fabricating a second part of the flexible package to house the flexible electronic device; and
sealing the flexible electronic device in the flexible package using the second part of the flexible package,
wherein the contacts are formed by:
oxidizing a substrate to form an oxide layer;
forming a dielectric layer on the oxide layer;
forming contacts on the dielectric layer;
forming a sensing film over the contacts; and
removing a portion of the substrate.

14. The method of claim 13, in which the step of fabricating the second part of the flexible package comprises printing the second part onto the first part of the flexible electronic device using a 3D printer, in which the printing step also seals the flexible electronic device in the flexible package.

15. The method of claim 13, in which the step of sealing the flexible electronic device comprises attaching the second part of the flexible package to the first part of the flexible package to encase the flexible electronic device.

16. The method of claim 13, in which the flexible electronic device comprises at least one of a NAND gate, NOR gate, inverter, and buffer.

17. The method of claim 13, in which the flexible electronic device comprises a flexible sensor.

18. The method of claim 13, in which the flexible electronic device comprises a ring oscillator.

* * * * *